(12) United States Patent
Madsen et al.

(10) Patent No.: US 6,624,503 B1
(45) Date of Patent: Sep. 23, 2003

(54) ELECTROMAGNETIC FILTERING STRUCTURE

(75) Inventors: Wayne A. Madsen, Kokomo, IN (US); Vineet Gupta, Noblesville, IN (US); Todd M. Poole, Novi, MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/106,753

(22) Filed: Mar. 26, 2002

(51) Int. Cl.[7] ............................................. H01L 23/552
(52) U.S. Cl. .................... 257/659; 257/428; 257/684; 257/688; 257/660
(58) Field of Search .................. 257/428, 684, 257/688, 659, 660; 331/67; 361/816

(56) References Cited

U.S. PATENT DOCUMENTS 5,500,789 A * 3/1996 Miller et al. ................. 361/816
5,639,989 A * 6/1997 Higgins, III ............ 174/35 MS

* cited by examiner

Primary Examiner—Nathan J. Flynn
Assistant Examiner—Scott Wilson
(74) Attorney, Agent, or Firm—Stefan V. Chmielewski

(57) ABSTRACT

A filter board for filtering electromagnetic emissions from an electronic device couples to a conductive housing in the device. The filter board includes a plurality of filter components connected to a substrate, which is coupled to a continuous ground plane. Signal lines from the electronic device are coupled to the filter components and pass through the substrate and ground plane before being connected to other circuits. The filter board prevents high frequency noise and excessive emissions from exceeding required limits.

11 Claims, 8 Drawing Sheets

ELECTROMAGNETIC FILTERING STRUCTURE

BACKGROUND OF THE INVENTION

1. Technical Field

The present invention relates to electromagnetic filtering, and more particularly to filtering high-frequency noise signals occurring in an electronic device.

2. Background of the Invention

Recent developments in mobile multimedia products for vehicles incorporate many diverse electronic products, such as computer boards, DVD players, video displays, modems, digital signal processors, into conventional product designs ordinarily having a simple radio. The high frequency and fast rise time of these additional circuits makes meeting electromagnetic compatibility (EMC) standards, especially with respect to radiated emissions, more difficult.

In product designs incorporating one or two devices, such as a radio and/or CD player, the device typically has a conductive housing. Control and display signals are transmitted from the device's main processor board through its conductive housing to a keyboard and display via a harness cable, flex circuit or a direct board-to-board connector. Any filtering of the signal transmission lines is done on the processor board. With optimized circuits, such as devices with typical clock frequencies of around 4 MHZ, the radiated emissions from the device can meet acceptable EMC levels.

Mobile multimedia devices, by contrast, often employ multiple circuits and modules with clock rates of 100 MHz or more, sub-nanosecond rise times, expanded mode processors and video signals of 25 MHz or more. These circuits possess both differential signals and common mode noise with harmonics extending on the order of GHz. Board-to-board cables connect multiple modules within the device, and the cables conduct noise throughout the device. Also, electromagnetic fields from the IC's and circuitry on the boards couple to the board-to-board cables, exacerbating noise and radiated emissions.

The higher noise and radiated emissions levels generated by mobile multimedia devices makes it more difficult to keep emissions within EMC standards. Using conventional methods to connect the display and keyboard in mobile multimedia devices will still allow signals and noise to be conducted through the conductive housing and onto the display and/or keyboard. The resulting energy radiation usually exceeds EMC standards, but the processor board in mobile multimedia devices is insufficient for filtering the signals due to the common mode and coupled noise as explained above.

There is a need for a structure that can filter signals emitted from devices, such as mobile multimedia devices, that generate higher noise levels.

SUMMARY OF THE INVENTION

Accordingly, the present invention is directed to a filtering device for controlling emissions from an electronic device having a conductive housing, comprising at least one filter component, a substrate supporting said at least one filter component, and a ground plane supporting said substrate, wherein the ground plane is to be connected to the conductive housing such that noise from the electronic device is grounded to the conductive housing via at least one of the ground plane and said at least one filter component.

The invention is also directed to an electronic device comprising a conductive housing, at least one device circuit, and a filter board for controlling emissions from said at least one device circuit, the filter board including at least one filter component, a substrate supporting said at least one filter component, and a ground plane supporting said substrate, wherein the ground plane is connected to the conductive housing such that noise from the device travels through said at least one filter component and is grounded to the conductive housing via the ground plane.

The invention is further directed to a method for filtering signal emissions from an electronic device having at least one device circuit, comprising the acts of placing a filter board having at least one filter component and a ground plane and connecting the ground plane to the conductive housing such that noise from the electronic device is grounded to the conductive housing via at least one of the ground plane and said at least one filter component.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
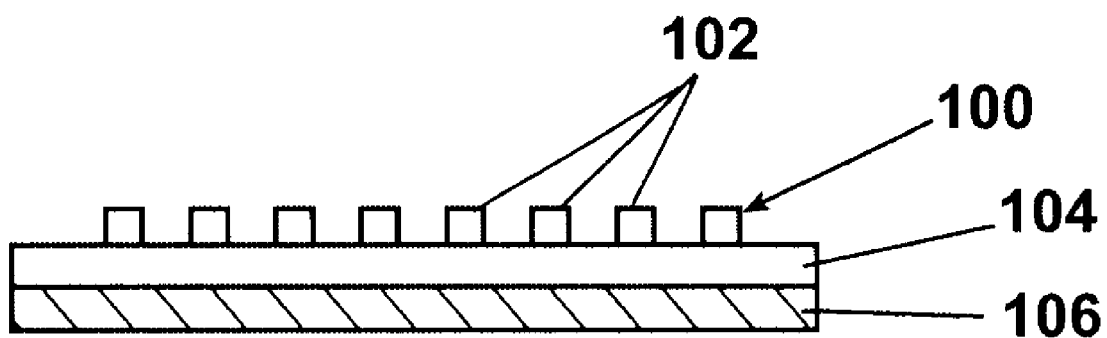
FIG. 1 is a representative side sectional view of one embodiment of a filtering device according to the present invention.

FIG. 1 is a representative diagram of a filtering device, such as a filter board 100, according to the present invention. The filter board 100 includes a circuit board formed by mounting one or more filter components 102 onto a substrate 104. The specific material used for the substrate 104 can be epoxy or fiberglass if the filter board 100 to form a conventional two-layer circuit board structure. Alternatively, the filter board 100 can be made from Mylar™ or Kapton™ to form a flexible circuit. Regardless of the specific substrate material used, conductive traces (shown in FIG. 5A) are disposed on one or both sides of the substrate 104. The filter components 102 are attached to the conductive traces on one side of the substrate 104, while a ground plane 106 is attached to the other side of the substrate 104. The conductive traces create a path for noisy signals from an input signal line to the filter components 102.

The filter components 102 themselves can be any component, such as a shunt element, that filters high frequency noise and can be disposed on either side of the substrate 104. The filter components 102 can be, for example, a grounded capacitor, an L-filter, a pi-filter, or any other filter than can pass a desired signal and reject high frequency noise. In one embodiment, the power, control and signal lines exiting an electronic device coupled to the filter pass through the filter components 102 so that the desired signal reaches its destination (e.g., keyboard, display) while any high frequency noise in the signal is grounded.

The ground plane 106 provides the actual grounding function in the filter board 100. Because of this function, the ground plane 106 should be made of an electrically conductive material, such as copper. The ground plane 106 should be continuous for as large a portion as possible to minimize impedance at the desired frequencies.

Figure 2:
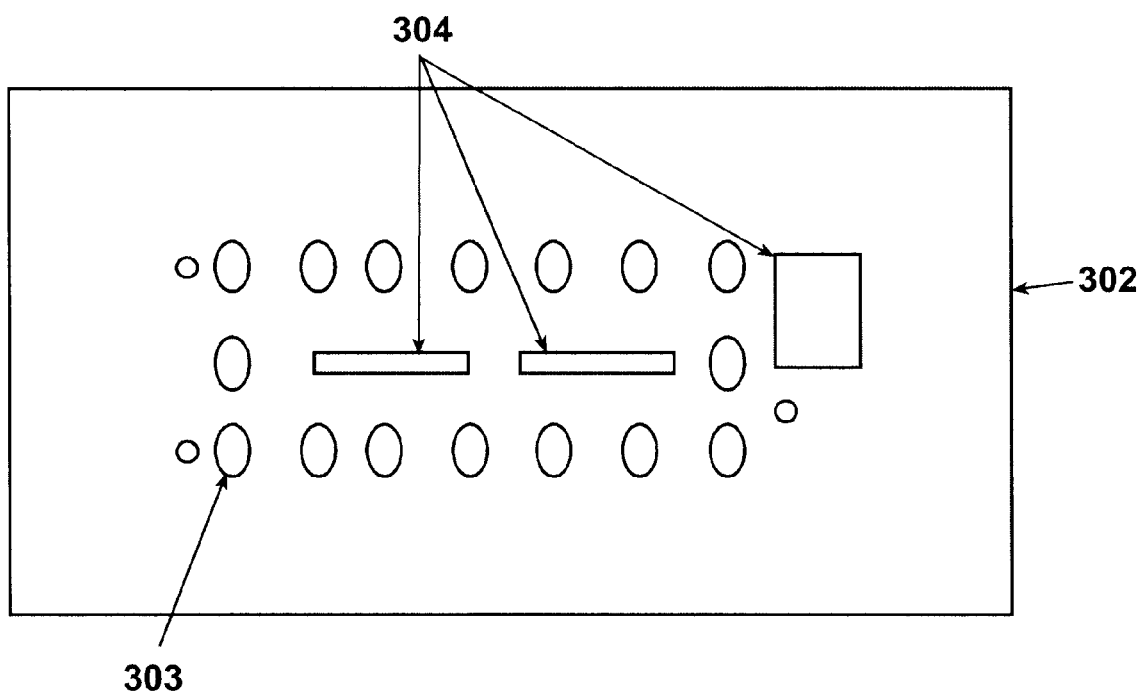
FIG. 2 is a representative front view of a conductive housing to be connected with the inventive filtering device.
Figure 3A:
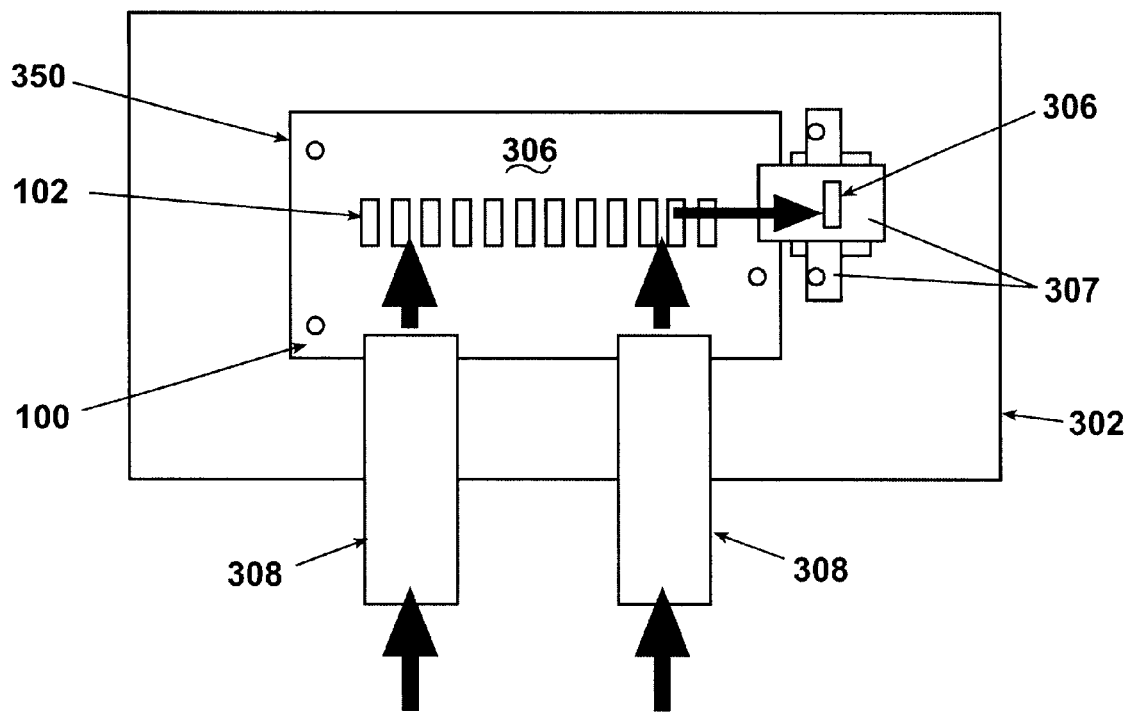
FIG. 3A is a representative front view of the conductive housing shown in FIG. 2 after being connected with the inventive filtering device.
Figure 3B:
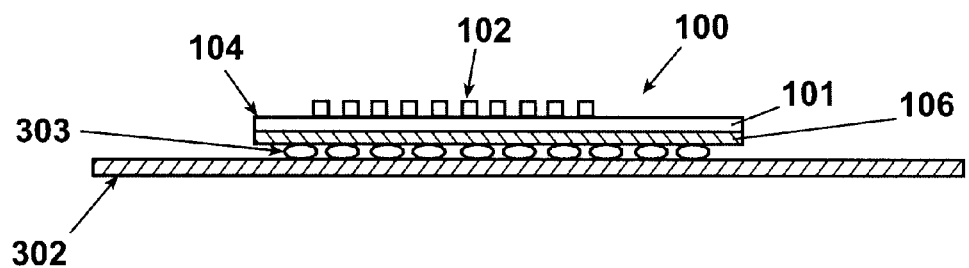
FIG. 3B is a representative side view of the conductive housing and inventive filtering device of FIG. 3A.

FIGS. 2, 3A and 3B illustrate possible ways in which the inventive filter board 100 can be coupled to an electronic device. In this example, the filter board 100 is connected to a conductive housing 302 to ground the conductive housing 302 and thereby ground signal noise. The actual connection structure between the conductive housing 302 and the filter board 100 can couple the conductive housing 302 to the filtering devices 102 in the filter board 100 and/or directly connect the filter board 100 to the conductive housing 302. Other possible connector options include but are not limited to cables, ribbons, wire cables, and flex circuits. These connection structures will be described in greater detail below.

FIG. 2 illustrates one possible conductive housing 302 configuration for accommodating the inventive filter board structure 100 to ensure optimum filtering. The conductive housing 302 in this embodiment has embossed portions, such as a plurality of emboss points 303, that are raised from the conductive housing 302 surface. The emboss points 303 provide low impedance paths for RF energy. In one embodiment, the emboss points 303 are spaced apart less than 1/10 of a wavelength apart for optimum emission reduction. The conductive housing 302 also has one or more openings 304 for accommodating connectors, such as screws and cables. Some of the openings 304 allow filtered signals to leave the conductive housing through the conductive housing 302. Regardless of the opening's purpose, the size of all openings 304 should be minimized to avoid RF leakage through the conductive housing 304. One possible guideline is to keep the opening dimensions around 1/10 to 1/20 of the wavelength of the highest frequency to be filtered to prevent radiation from escaping the housing.

FIGS. 3A and 3B illustrate the conductive housing 302 of FIG. 2 after the inventive filter board 100 has been attached to the conductive housing 302 with fasteners 350, such as screws, pegs, or any other similar fastening structure. The emboss points 304 contact the ground plane 106 of the filter board 100 to create a Faraday shield, which effectively reduces emissions. A board-to-board connector 306 having flexible tabs 307 may also be attached to the conductive housing 304 and the filter board 100 with conductive adhesive and grounded. In one embodiment, the connector 306 faces the outside of the conductive housing 302 for connection to a display or another electronic sub-assembly (not shown).

Cables, such as wire bundles or flexible circuits can act as signal lines 308 connecting modules (not shown) inside the conductive housing 302 through filter board 100 to a desired circuit on the outside of the conductive housing 302. The pass-through connection can be, for example, a wire conductor or a plated via. Note that the arrows entering and exiting the signal lines 308 shown in FIG. 3A represent the signal flow through the signal lines 308. Regardless of the specific pass-through connection used, any openings in the ground plane 104 allowing the signal line 306 to connect to components outside the conductive housing should be minimized. In this way, any noise voltage either conducted directly from a noisy PCB or coupled onto the cable is shunted to a low impedance ground with the return current conducted back to the source via the conductive housing's own ground. Thus, the noise voltages on any lines exiting the housing are reduced as much as possible, reducing radiated emissions.

The ground plane 106 of the filter board 100 may be designed to cover the openings 304 on the conductive housing 302. This reduces aperture radiation, which can otherwise result from currents flowing around the openings 304 due to any electromagnetic fields inside the housing 302 from signal lines 308 or other sources. Note that in the embodiments shown in FIGS. 5A and 5B, the filter board 100 has two ground planes 106 disposed on either side of the substrate 104. In this embodiment, the filtering devices 102 are attached to one of the ground planes 106 to be supported by the substrate 104.

To provide good coupling, the ground plane 106 can be bonded to the conductive housing 302 at selected points, such as the emboss points 303 described above, or continuously with a conductive gasket material or similar material. The filter board 100 may include conductive vias 400 that couple the ground plane to the emboss points 303 on the conductive housing 302. Regardless of the specific connection between the ground plane 106 of the filter board 100 and the conductive housing 302, good connection between the ground plane 106 and the conductive housing 302 provides an effective Faraday shield at the frequencies of interest to reduce emissions.

Once the filter board 100 is connected to the conductive housing 302, noisy signals inside the conductive housing 302 travel through signal lines 308 through the filter board 100 and terminate at the board-to-board connector 306. Once the signals reach the board-to-board connector 306, any RF emissions in the signal are greatly reduced.

Figure 4A:
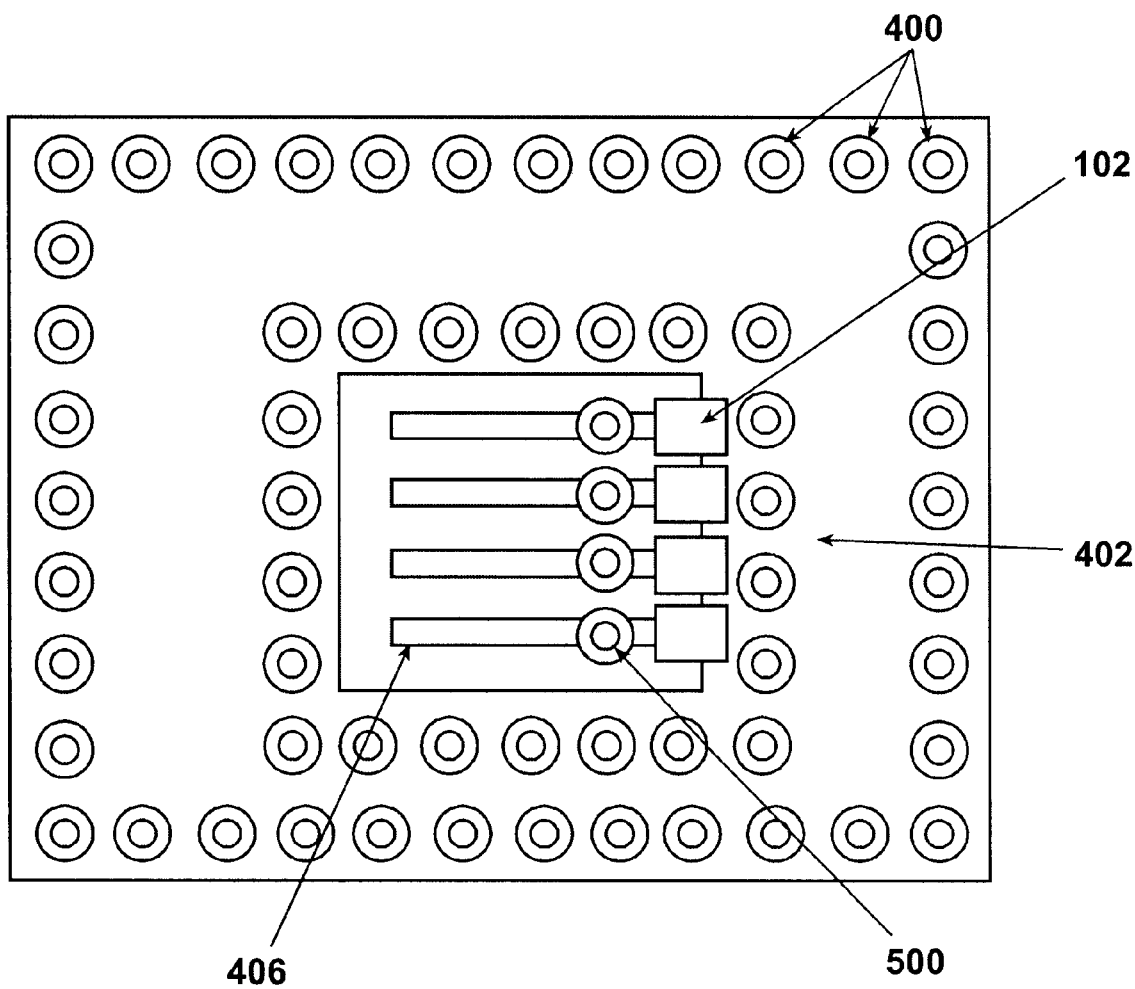
FIGS. 4A and 4B are plan views of one embodiment of the inventive filter board.
Figure 4B:
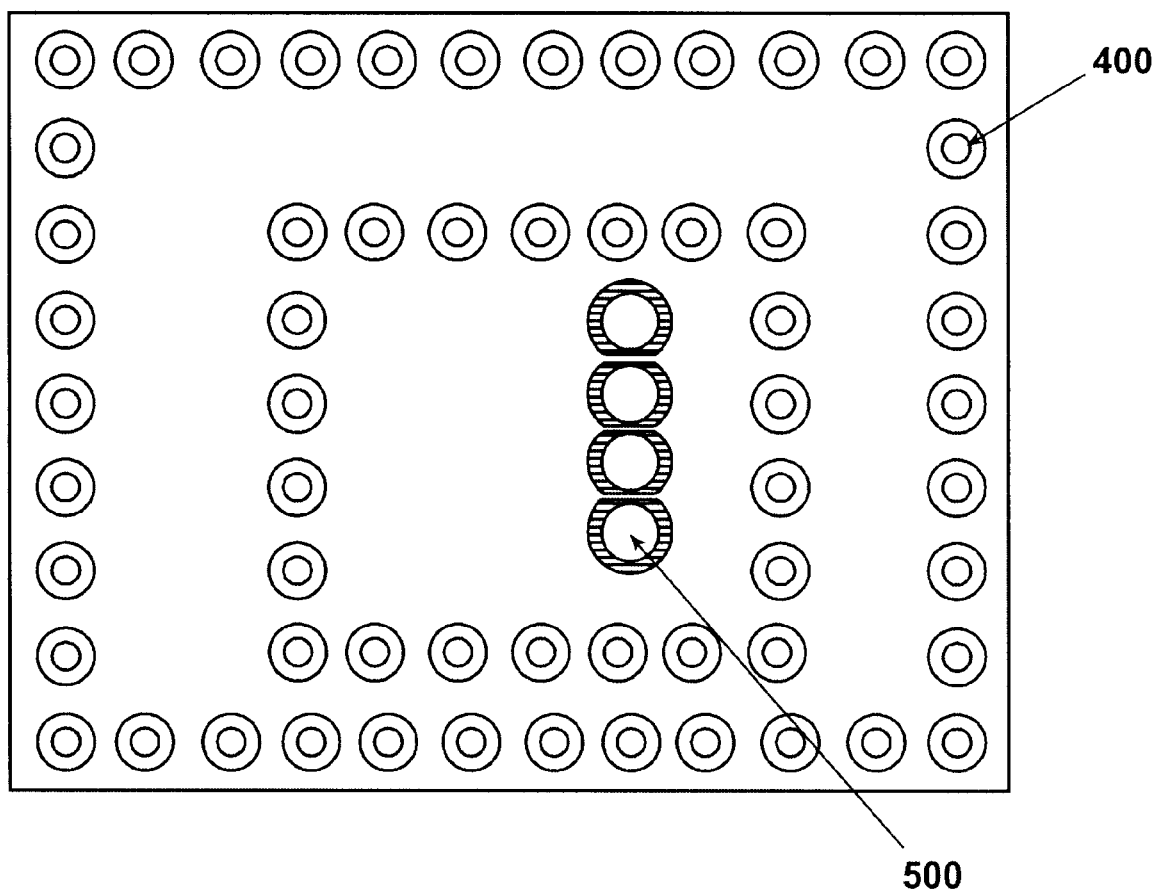

FIGS. 4A and 4B illustrate the filter board 100 in more detail. As can be seen in the Figure, the filter board 100 includes one or more output vias 500 for allowing the signal lines 308 to pass through the filter board 100, additional vias 400 to maintain the Faraday shield formed by mating the ground plane 106 and the conductive housing 302, one or more filter components 102, and a circuit trace 406 that directs signals from input signal lines 600 through the filter components 102 to the output vias 500. In one embodiment, the entrance and exit portions of the output vias 500 may be larger than the via portion extending through the filter board 100 itself.

Figure 5A:
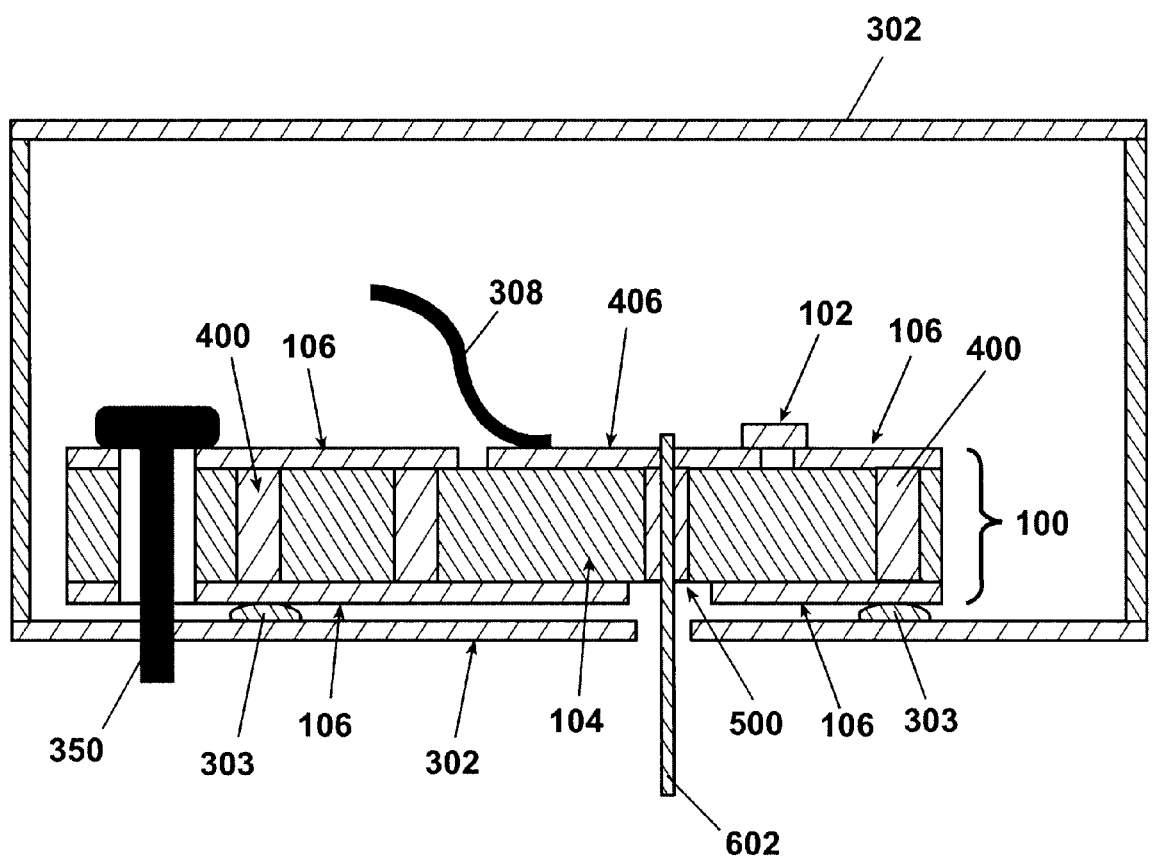
FIGS. 5A, 5B, and 5C are representative side sectional views illustrating two embodiments of the inventive filter board coupled to an electronic device housing.
Figure 5B:
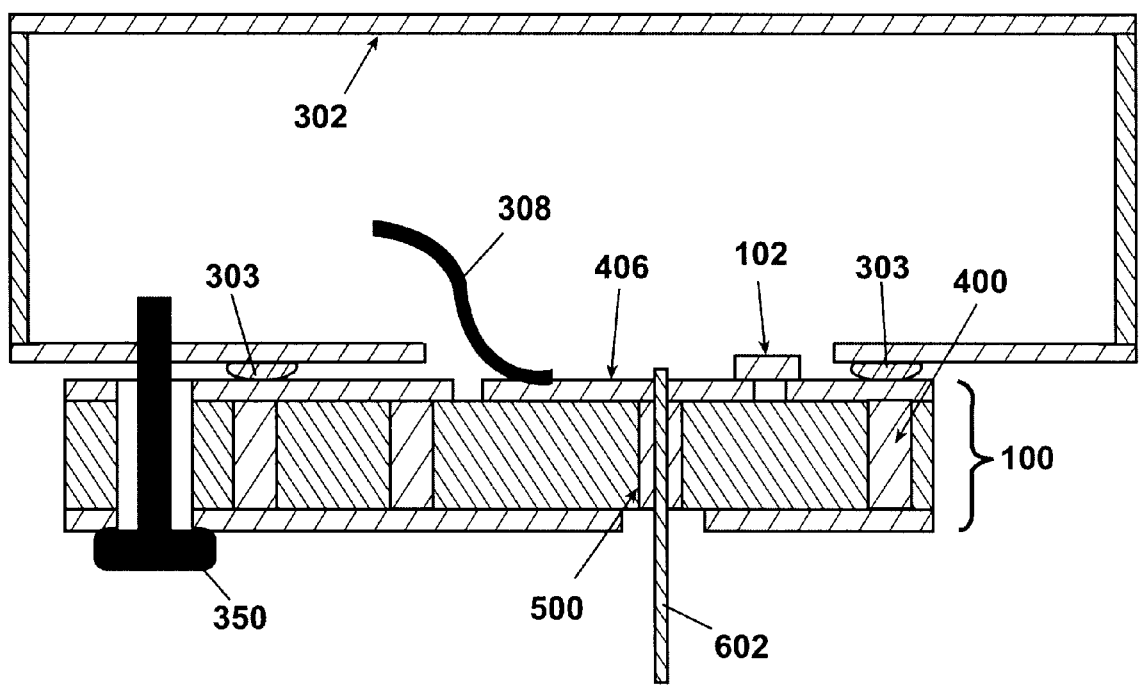
Figure 5C:
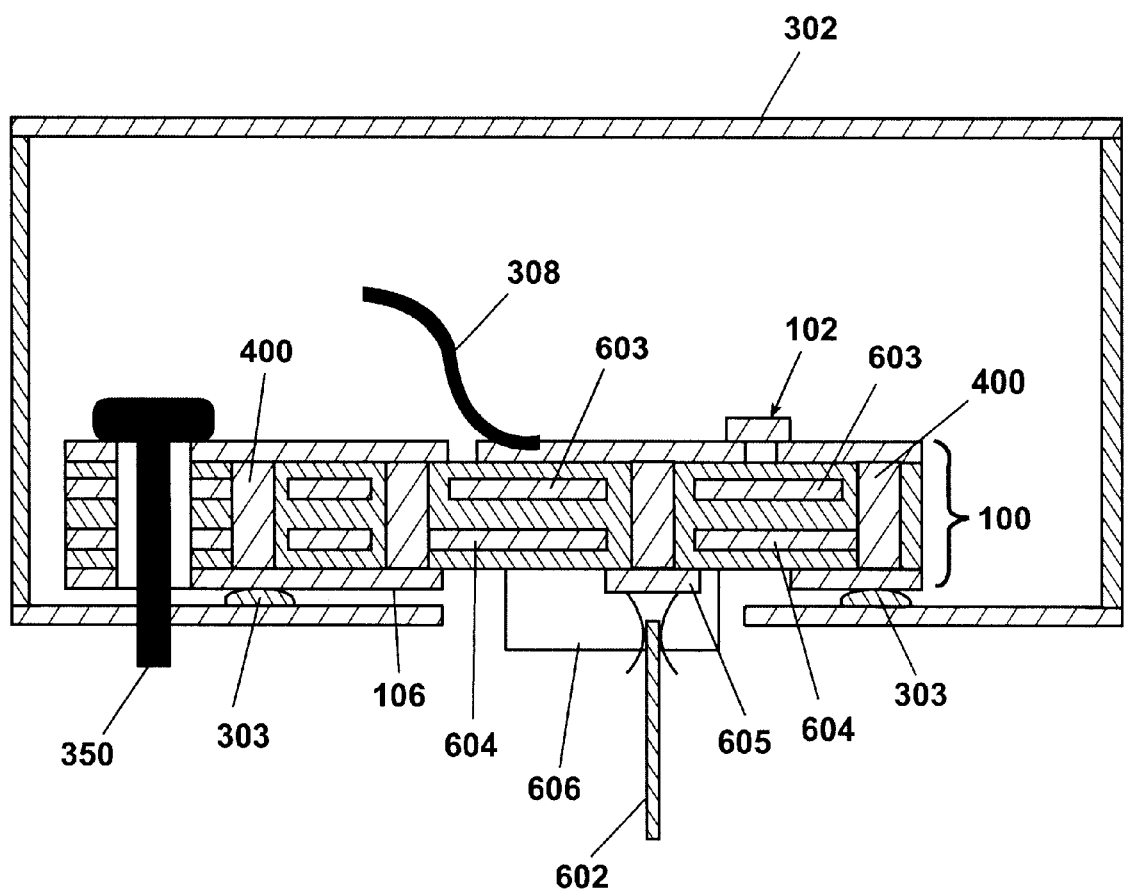

FIGS. 5A, 5B, and 5C illustrate three possible ways in which the inventive filter board 100 can be connected to the conductive housing 302. FIGS. 5A and 5C illustrate one embodiment where the filter board 100 is attached to an inside surface of the conductive housing 302, while FIG. 5B illustrates an embodiment where the ground plane 106 of the, filter board 100 is attached to an outside surface of the conductive housing 302. In each embodiment, the filter board 100 is attached to the housing 302 with the fastener 350. The emboss points 303 on the conductive housing 302 contact the ground plane 106 of the filter board 100. A plurality of vias 400 provide interconnection of the upper and lower segments of the ground plane 106. Further, as shown in the Figures, noisy signals from an input signal line 308 travel through the circuit trace 406 to the filter components 102, which shunt the noise to the ground plane 106, allowing a clean, filtered signal to leave the filter board through an output signal line 602.

Note that the filter board 100 in the embodiment shown in FIG. 5C includes two inner layers 603, 604 disposed between the ground planes 106. In one embodiment, circuit traces (not shown) may be routed on the inner layers 603, 604. One of the inner layers 604 may be constructed to contact one or more of the output vias 500 and act as an inner ground plane to maintain a Faraday shield. Although the embodiment in FIG. 5C shows a filter board 100 with two inner layers, the filter board 100 may be constructed with any number of inner layers and/or without any inner ground plane, if desired. In such a case, the inner layers simply act as supports for circuit traces and do not need to contact any of the output vias 500 to maintain a Faraday shield. Additional circuitry (not shown) may also be interconnected using the inner layers 603, 604 in the filter board, if needed.

Further, in the embodiment shown in FIG. 5C, the output trace 602 travels through a solder pad 605 and a connector 606. The connector 606 may have a large aperture that would ordinarily allow electromagnetic fields to escape. The inner ground plane 604 helps re-establish a Faraday shield to block emissions. Those of skill in the art will understand that elements of the different embodiments shown in FIGS. 5A, 5B, and 5C can be combined in different ways without departing from the scope of the invention.

The inventive filter board 100 therefore effectively filters even high levels of noise and electromagnetic emissions while maintaining a simple, easily connectable structure. The filter board 100 allows efficient routing of signal lines, which in turn leads to a higher quality and more reliable electronic device overall. Note that although the description above focuses on reducing radiated emissions, the inventive structure can also reduce conductive emissions as well, such as those encountered on device harness connectors.

It should be understood that various alternatives to the embodiments of the invention described herein may be employed in practicing the invention. It is intended that the following claims define the scope of the invention and that the method and apparatus within the scope of these claims and their equivalents be covered thereby.

What is claimed is:

1. An electric device, comprising:
   a conductive housing;
   at least one device circuit; and
   a filter board for controlling emissions from said at least one device circuit, the filter board including at least one filter component, a substrate supporting said at least one filter component, and a ground plane supporting said substrate,
   wherein the ground plane is connected to the conductive housing such that noise from the device travels through said at least one filter component and is grounded to the conductive housing via the ground plane, further comprising a connection that connects said filter board to said at least one filter component.

2. The electronic device of claim 1, wherein the conductive housing has at least one embossed portion that contacts the filter board to ground the filter board to the conductive housing.

3. The electronic device of claim 1, wherein the filter board is bonded to the conductive housing with a conductive gasket material.

4. The electronic device of claim 1, wherein said at least one filter component comprises at least one selected from the group consisting of a capacitor, L-filter, pi-filter, and low pass filter.

5. The filtering device of claim 1, wherein the substrate is one selected from the group consisting of a printed circuit board and a flex circuit.

6. The electronic device of claim 1, wherein the ground plane is substantially continuous.

7. The electronic device of claim 1, wherein the connector is one selected from the group consisting of a cable, ribbon, wire cable, board-to-board connector and flex circuit.

8. The electronic device of claim 1, wherein the conductive housing has at least one aperture, and wherein the filter board covers said at least one aperture.

9. The electronic device of claim 1, further comprising a second ground plane, wherein the substrate is disposed between the ground plane and the second ground plane and wherein said at least one filter component is attached to one of the ground plane and the second ground plane to be supported by the substrate.

10. The electronic device of claim 9, further comprising a second ground plane, wherein the substrate is disposed between the ground plane and the second ground plane and wherein said at least one filter component is attached to one of the ground plane and the second ground plane to be supported by the substrate.

11. The electronic device of claim 1, further comprising a circuit trace for directing a signal to said at least one filter component.

* * * * *